(12) United States Patent
Le-Gall et al.

(10) Patent No.: US 6,894,789 B2
(45) Date of Patent: May 17, 2005

(54) METHOD OF EXTENDING THE CAPTURE RANGE OF A WAVELENGTH MONITOR AND A WAVELENGTH MONITOR AND LASER SYSTEM THEREFOR

(75) Inventors: Franck Le-Gall, Paris (FR); Daniel Mousseaux, St. Arnoult en Yvelines (FR)

(73) Assignee: Avanex Corporation, Fremont, CA (US)

( * ) Notice: Subject to any disclaimer, the term of this patent is extended or adjusted under 35 U.S.C. 154(b) by 603 days.

(21) Appl. No.: 09/943,349

(22) Filed: Aug. 31, 2001

(65) Prior Publication Data

US 2002/0044286 A1 Apr. 18, 2002

(30) Foreign Application Priority Data

Sep. 1, 2000 (EP) .......................................... 00440237

(51) Int. Cl.[7] .......................... G01B 9/02; G01C 19/66; G01J 3/45
(52) U.S. Cl. ..................... 356/519; 356/520; 356/470; 356/454
(58) Field of Search ............................. 356/519, 520, 356/470, 454

(56) References Cited

U.S. PATENT DOCUMENTS

| | | | |
|---|---|---|---|
| 4,815,081 A | | 3/1989 | Mahlein et al. |
| 5,331,651 A | * | 7/1994 | Becker et al. ................. 372/32 |
| 5,438,579 A | * | 8/1995 | Eda et al. ...................... 372/34 |
| 5,798,859 A | | 8/1998 | Colbourne et al. |
| 6,067,181 A | | 5/2000 | Mizrahi |
| 6,233,263 B1 | * | 5/2001 | Chang-Hasnain et al. .... 372/32 |

* cited by examiner

Primary Examiner—Gregory J. Toatley, Jr.
Assistant Examiner—Khaled Brown
(74) Attorney, Agent, or Firm—Moser, Patterson & Sheridan, L.L.P.

(57) ABSTRACT

The invention relates to a method of extending the capture range (CR) of a wavelength monitor for the lasers of a wavelength division multiplex (WDM) transmission system wherein the capture range (CR) comprises one wavelength period (FSR) of a periodic error signal (E) generated with the aid of the wavelength filter (4), the capture range contains a desired wavelength ($\lambda_0$) of a plurality of equidistant wavelengths ($\lambda_i, \lambda_{i+1}, \lambda_{i+2}, \ldots$), each of the lasers of the WDM transmission system is set at a desired wavelength ($\lambda_0$) by comparing the error signal (E) with an comparison value (C1 or C2), that is unique in the capture range (CR) for a chosen slope sign, the wavelength period (FSR) of the error signal (E) is set such that it corresponds to double the wavelength spacing (A) of two adjacent wavelengths of the WDM transmission system and the desired wavelength ($\lambda_0$) is set taking into account the slope sign of the error signal (E), and further relates to a wavelength monitor and laser system therefor.

7 Claims, 4 Drawing Sheets

METHOD OF EXTENDING THE CAPTURE RANGE OF A WAVELENGTH MONITOR AND A WAVELENGTH MONITOR AND LASER SYSTEM THEREFOR

BACKGROUND OF THE INVENTION

The invention is based on a priority application EP 00440237.6, which is hereby incorporated by reference.

The invention relates to a method of extending the capture range of a wavelength monitor for the lasers of a wavelength division multiplex (WDM) transmission system wherein the capture range comprises one wavelength period of a periodic error signal generated with the aid of the wavelength filter, the capture range contains a desired wavelength of a plurality of equidistant wavelengths, each of the lasers of the WDM transmission system is set at a desired wavelength ($\lambda_0$) by comparing the error signal (E) with a comparison value (C1 or C2), that is unique in the capture range (CR) for a chosen slope sign, the wavelength period of the error signal is set such that it corresponds to double the wavelength spacing of two adjacent wavelengths of the WDM transmission system and the desired wavelength is set taking into account the slope sign of the error signal, to a wavelength monitor with a wavelength filter and means of generating a periodic error signal for setting a laser, where the capture range of the irradiated wavelength comprises one wavelength period of the error signal and contains a desired wavelength of a plurality of equidistant wavelengths of a WDM transmission system, and to a laser system with lasers and at least one wavelength monitor, wherein each of the lasers is set at a desired wavelength with the aid of an error signal.

WDM methods are increasingly being used in optical transmission systems. In such methods a number of modulated optical carriers with differing frequencies are transmitted simultaneously in a glass fibre. Each of these carriers forms a channel which is logically independent of the carriers, each channel being fed by one laser. To increase the transmission capacity, the number of channels of WDM transmission systems is increasingly being enlarged, the frequency spacing and thus also the wavelength spacing being increasingly reduced. In present-day transmission systems with so-called dense WDM (DWDM), referred to in the following as DWDM transmission systems, for example 16 channels are transmitted with an equidistant frequency spacing of 100 GHz. To further increase the transmission capacity, in accordance with the International Telecommunication Union (ITU) it is proposed that this frequency spacing be halved to 50 GHz. However, with decreasing frequency spacing, the demands on the accuracy and stability of the wavelengths emitted by the laser diodes, also referred to in the following as ITU wavelengths, become greater. The ITU permits a wavelength deviation of a maximum 10% of the wavelength spacing between two adjacent channels, also referred to in the following as ITU wavelength spacing.

The wavelength of a laser diode, abbreviated to laser in the following, is a function of its temperature. With the aid of a controllable laser heating unit, this temperature is set such that the desired wavelength is emitted. For this purpose, with the aid of a wavelength monitor, a wavelength-dependent error signal is generated, from which a suitable control signal is formed for controlling the laser heating unit. In the wavelength monitor, the fed-in laser light is split by a splitter in two optical branches; in the first optical branch the light is directly fed to a first photodiode, while the light in the second optical branch passes through a wavelength filter before striking a second photodiode. While the first photodiode of the wavelength monitor supplies a current which is proportional to the intensity of the fed-in laser light independently of the wavelength, the second photodiode supplies a current periodic with the wavelength. The error signal is generated for example by forming the difference between the output currents of the photodiodes. In order that all the lasers of a DWDM transmission system can each be set at a ITU wavelength with the aid of a wavelength monitor, the period spacing, also known as the free spectral range (FSR), of the wavelength filter must correspond exactly to the ITU wavelength spacing. To achieve in each case an unequivocal setting of the lasers at a specific ITU wavelength, it must be ensured that, before the wavelength control comes into effect, the emission of each laser always falls within a specific wavelength range. This wavelength range, also referred to in the following as capture range (CR), corresponds to the free spectral range, whereby a capture range in each case contains only the desired ITU wavelength.

As a result of the previously described, planned reduction in the ITU wavelength spacing, the free spectral range of the wavelength filter is reduced proportionally. Consequently the capture range is also reduced proportionally.

Lasers undergo a shift in the emitted wavelength due to ageing. The capture range should therefore be sufficiently large to ensure that the emitted wavelength still falls in the capture range even after ageing. If the capture range is too small, the risk exists that after a certain period of time the wavelength will be outside the capture range and therefore can no longer be set at the provided ITU wavelength.

When a Fabry Perot (FP) interferometer is used as wavelength filter, also referred to in abbreviated form as FP interferometers in the following, the reduction in the ITU wavelength spacing also leads to an enlargement of the air gap, which runs counter to the endeavoured increasing integration of the optical components.

SUMMARY OF THE INVENTION

The object of the invention is, commencing from the previously described method, to provide a method and means to extend the capture range.

The basic principle of the invention is that in the formation of the control signal for the wavelength adjustment of the laser, the sign of the gradient of the error signal is taken into account in the desired ITU wavelength. In each period the error signal has exactly one part with a positive slope and one part with a negative slope; the error signal is generated in such manner that the ITU wavelengths in each case occur alternately at locations of the error signal with a positive and a negative gradient. The ITU wavelength spacing is therefore halved compared to the free spectral range and thus also the capture range. However, as the periodic transmission curve of a FP interferometer has relatively sharp peaks and is relatively flat in between, comparison values leading to an equidistant distribution of ITU wavelengths over this error signal curve would occur in the flat areas of this curve, resulting in an impairment of the quality of the wavelength control process. To attain the same quality of the control process as the prior art, a modified error signal is generated which is sinusoidal or at least sine-like. For such an error signal, equidistant comparison values can in each case be defined in the steep areas of the error signal. Two different methods of obtaining such an error signal are proposed. In a first method, a suitable error signal is obtained in that the FP interferometer of a wavelength monitor of the type described in the introduction is changed in that the angle of incidence of the light entering the FP interferometer is non-parallel to the optical axis. This gives rise to a sine-like error signal. In a second method, an additional measurement is made of the reflection component of the light entering the FP interferometer of a wavelength monitor of the type described in the introduction by means of a third photodiode. Suitable linking of the output currents of the three photodiodes gives rise to a sinusoidal error signal.

Further developments of the invention can be gathered from the dependent claims and the following description.

BRIEF DESCRIPTION OF THE DRAWINGS

In the following the invention will be explained further making reference to the attached drawings in which:

FIG. 1 schematically illustrates the construction of a wavelength monitor. The wavelength monitor comprises an optical splitter 3, a wavelength filter 4, a first photodiode P1 and a second photodiode P2. An optical input signal $l_0$ is fed to the optical splitter 3 which splits the input signal $l_0$ between two optical outputs. The first output signal of the optical splitter 3 is fed directly to the first photodiode P1. The second optical output signal of the optical splitter is fed via the interposed wavelength filter 4 to the second photodiode P2. The photodiodes P1 and P2, whose electrical terminals have not been shown here, supply a first photocurrent $l_1$ and a second photocurrent $l_2$ respectively, the waveforms of which have been plotted over the wavelength $\lambda$ of the optical input signal $l_0$. Whereas the first photocurrent $l_1$ is constant with a varying wavelength $\lambda$, the second photocurrent $l_2$ changes with a varying wavelength $\lambda$. So-called Mach-Zehnder interferometers or Fabry Perot interferometers can be used for example as wavelength filters. FP interferometers are preferably used for reasons of economy. A FP interferometer fundamentally consists of two reflective parallel surfaces, between which an air gap is present. The light input-coupled by a collimating lens is reflected back and forth between these surfaces as often as desired, a specific component of the light being input-coupled into the output fibre upon each reflection. The superimposition of these light components gives rise to an intensity characteristic which is periodic over the wavelength, the period spacing being inversely proportional to the air gap spacing. The period spacing represents the above mentioned free spectral range (FSR).

FIG. 2 illustrates the principle of the wavelength control of a laser. A portion of the difference between the previously mentioned photocurrents $l_2$–$l_1$ is plotted over the wavelength $\lambda$. This difference here represents the error signal referred to in the introduction. In the illustrated portion the value of the error signal rises monotonously over the wavelength and intersects the abscissa at the value $\lambda_0$ at which the laser is to be set. Above this wavelength the error signal is positive and falls in the cooling area of the wavelength control. Below this wavelength the error signal is negative and falls in the heating area of the wavelength control. When the laser is switched on, the laser generally firstly emits a wavelength which differs from the desired value $\lambda_0$ and which leads to a negative error signal in the case of a negative wavelength deviation. The laser is then heated until the desired wavelength $\lambda_0$ is attained and the error signal thus assumes the value zero. In the case of a positive wavelength deviation, and thus a positive error signal, the laser is cooled until the error signal again disappears and the desired wavelength $\lambda_o$ is thus attained. The desired wavelength $\lambda_0$ can be changed by varying the amplification of the photodiodes P1 and P2 and/or by changing the parameters of the wavelength filter 4.

FIG. 3 illustrates an error signal E1 which is periodic over the wavelength $\lambda$ and which is formed for example by the difference between the two currents $l_2$ and $l_1$ described in FIG. 1. The error signal E1 intersect the zero line (abscissa) periodically with its negative slope parts. The spacing between these intersection points corresponds to the ITU wavelength spacing, the intersection points representing the ITU wavelength $\lambda_i$, $\lambda_{i+1}$, $\lambda_{i+2}$, . . . , of the DWDM transmission system. Also shown is a capture range CR which comprises exactly one period of the periodic error signal E1. The capture range CR is the range in which laser emission can take place for an unequivocal setting at the desired ITU wavelength $\lambda_1$. This range must therefore contain no further intersection point of the periodic error signal E1 with the zero line other than at the desired ITU wavelength $\lambda_i$, as the laser could otherwise be set at such an intersection point and thus at an incorrect wavelength. As previously mentioned, increasingly smaller ITU wavelength spacings are being implemented in DWDM transmission systems. In accordance with the prior art, the free spectral range (FSR), and thus also the capture range (CR), are reduced proportionally thereto. However the reduction in the capture range CR gives rise to problems in terms of the long-term stability of the laser system: lasers undergo a shift in the emitted wavelength due to ageing. The capture range should therefore be sufficiently large to ensure that the emitted wavelength still falls in the capture range after ageing. If the capture range CR is too small, the risk exists that after a specific period of time the wavelength will lie outside the capture range CR and therefore can no longer be set at the desired ITU wavelength $\lambda_i$. A further disadvantage of the use of a FP interferometer is the increase in size due to the required enlargement of the air gap. The following FIG. 4 illustrates a proposed solution to these problems which in particular facilitates a halving of the ITU wavelength spacing with the same capture range CR. By way of an example, FIG. 4 illustrates an error signal E2, which is sinusoidal over the wavelength $\lambda$, of a wavelength monitor according to the invention. The intersection points of the negative slope parts of the sinusoidal error signal E2 with a first comparison value C1 and of its positive slope parts with a second comparison value C2 occur at equidistant wavelengths with the ITU wavelength spacing A, these being represented for example by the ITU wavelengths $\lambda_i$, $\lambda_{i+1}$, $\lambda_{i+2}$, ..., known from FIG. 3. As in FIG. 3, the capture range CR comprises one period of the sinusoidal error signal E2. Compared to only one ITU wavelength spacing A according to FIG. 3, here the capture range CR corresponds to two ITU wavelength spacings. As however the ITU wavelengths $\lambda_i$, $\lambda_{i+1}$, $\lambda_{i+2}$, ..., here occur alternately at intersection points of the first comparison value C1 with the negative slope parts and at intersection points of the second comparison value C2 with the positive slope parts of the sinusoidal error signal E2, the sign of the slope must be taken into account in the formation of the control signal for the control of the laser heating unit. In this way, depending upon the slope sign, the laser heating unit is switched on either in the case of a positive or a negative difference between the sinusoidal error signal E2 and the corresponding comparison value C1 or C2.

The following parameters are thus defined for each ITU wavelength and are stored in the wavelength monitor or the laser system:
 the capture range CR,
 the slope sign (positive or negative) and
 the comparison value (C1 or C2).

Figure 3:
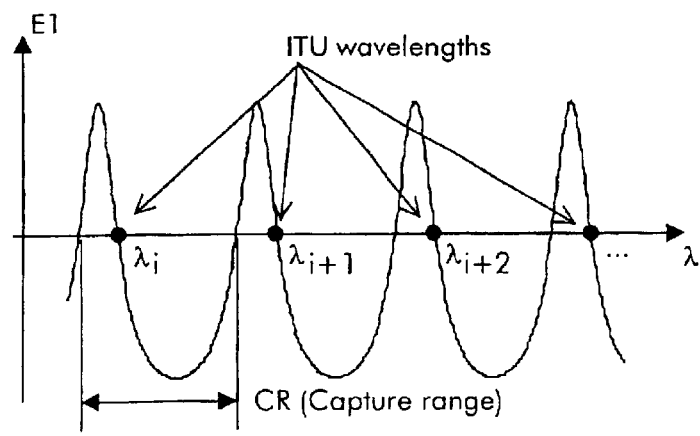
FIG. 3 illustrates the error signal of a wavelength monitor according to the prior art.

However, a problem resides in the generation of a suitable error signal, for example the sinusoidal error signal E2 shown here. The periodic error signal E1 illustrated in FIG. 3 corresponds to the transmission curve of a FP interferometer which has relatively sharp peaks and is flat in between (see FIG. 6). If this periodic error signal E1 were divided equidistantly so that the ITU wavelengths lie alternately on a positive and a negative slope part of the error signal E1, the comparison values C1 and C2 would fall in the flat areas of the periodic error signal E1, resulting in an impairment of the quality of the wavelength controlling process driven by the wavelength monitor. To achieve a wavelength controlling process with the same quality as in the prior art, it is necessary to form an error signal which permits an equidistant division in each case at steep slopes of the error signal. The sinusoidal error signal E2 shown here or a sine-like error signal is suitable for this purpose. Two methods of generating such an error signal are to be described by way of example in the following drawings.

Figure 5:
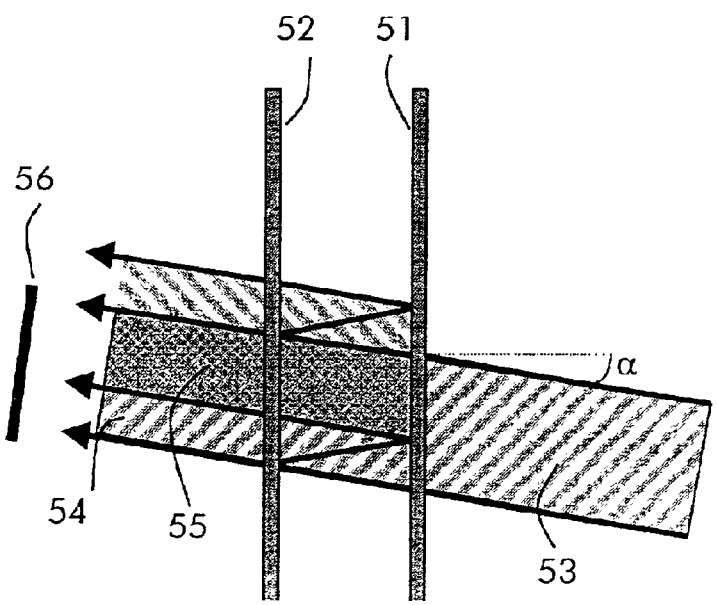
FIG. 5 is a basic diagram of a FP interferometer for a first embodiment of a wavelength monitor according to the invention.

FIG. 5 is a basic diagram of a FP interferometer which is used as wavelength filter 4 in a first embodiment of a wavelength monitor according to the invention. A first (optical) mirror 51 and a second (optical) mirror 52 have been shown. From the right, a broad, normally distributed beam 53 enters the FP interferometer at an angle of incidence α, a first part of the beam passing through the two mirrors 51 and 52 to strike a photodiode 56 with a large surface area, while a further part of the beam is reflected by the second mirror 52 to the first mirror 51 and from there back to the second mirror 52, a portion thereof in turn striking the photodiode 56 offset relative to the said first part. Here the photodiode 56 is positioned for example such that it is symmetrically irradiated by the said first part of the beam. Due to the fact that the angle of incidence α differs from zero, no interference occurs over the entire surface of the photodiode 56; by way of simplification, a part 55 in the case of which periodic interferences occur, and a part 54 in the case of which no interferences occur have been shown here.

Figure 6:
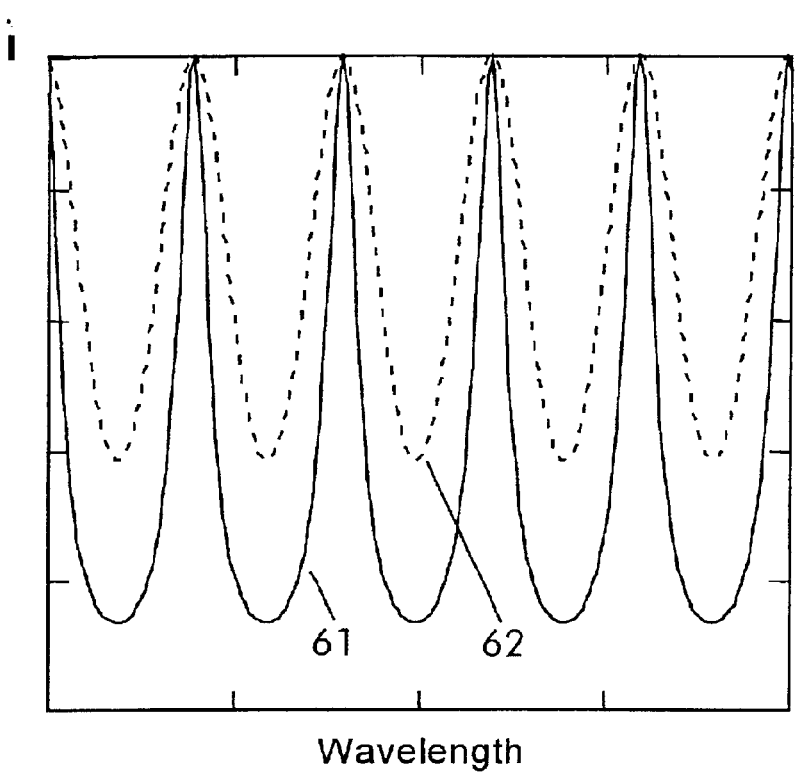
FIG. 6 illustrates the measurement result of the error signal of a laboratory model according to the first embodiment.

FIG. 6 illustrates a measurement result of a transmission curve 61 of a FP interferometer of a first laboratory model according to the description of FIG. 5. The angle of incidence α differs from zero. The waveform of its amplitude 1 of the transmission curve 61 has been plotted over the wavelength in FIG. 6. By way of comparison, the waveform of a second transmission curve 62 for an angle of incidence of 0° corresponding to the prior art described in the introduction has also been shown. The transmission curves 61 and 62 have been normalised for easier comparison. It can clearly be seen that the transmission curve 61 has a sine-like form while the transmission curve 62 has sharp peaks.

Figure 1:
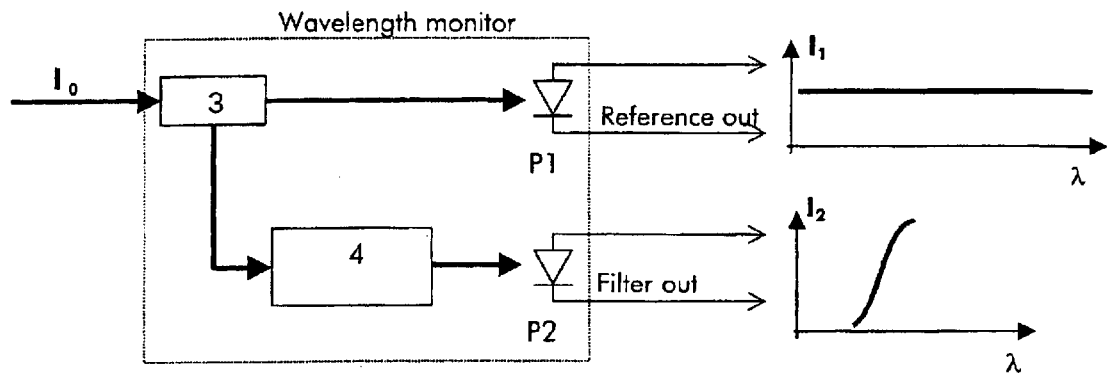
FIG. 1 illustrates the construction of a wavelength monitor according to the prior art.
Figure 2:
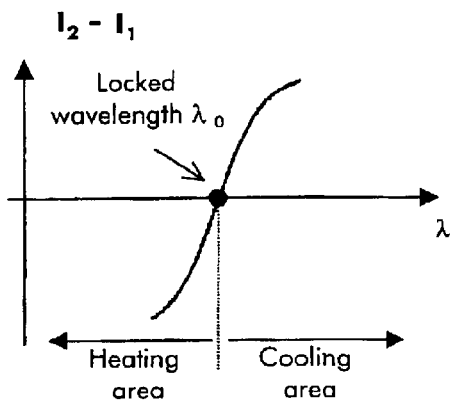
FIG. 2 is a basic diagram of the wavelength control of a laser.
Figure 7:
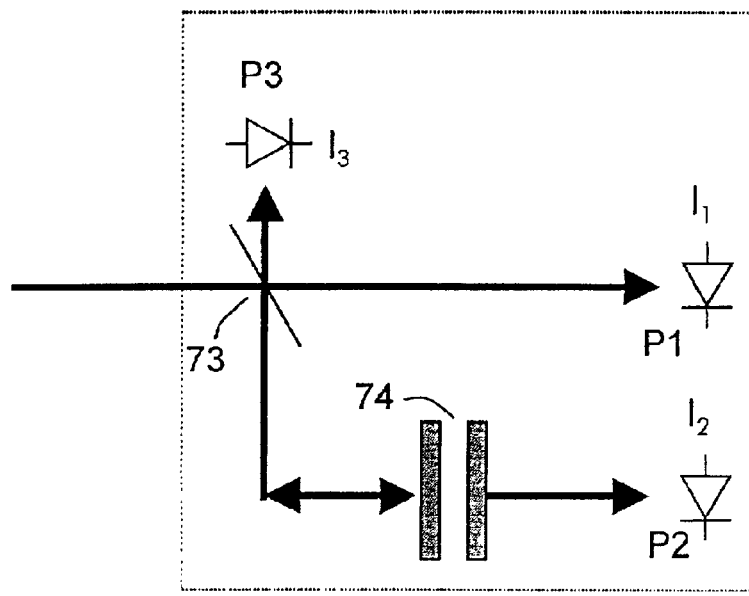
FIG. 7 illustrates the construction of a second embodiment of a wavelength monitor according to the invention and FIG. 8 illustrates the measurement result of the error signal of a laboratory model according to the second embodiment.

FIG. 7 illustrates the construction of a second embodiment of a wavelength monitor according to the invention as an extension of the wavelength monitor described with reference to FIG. 1. The wavelength monitor consists of the first photodiode P1, the second photodiode P2, a splitter 73 modified in relation to FIG. 1 with an additional optical output leading to an additional third photodiode P3, and the wavelength filter in the form of the FP interferometer 74. The modified splitter 73 is constructed as a semi-transparent, optical mirror which splits the optical signal $l_0$ between two outputs as in FIG. 1. The first output signal is fed directly to the first photodiode P1 and the second output signal to the FP interferometer 74, by which this signal is in part fed to the second photodiode P2 and in part reflected to the modified splitter 73, whose optical mirror feeds this signal component via the forementioned additional optical output to the third photodiode P3. The photocurrents generated in the photodiodes P1, P2 and P3 are proportional to the intensity of the received light signals.

The intensity $l_2$ of the light component transmitted by the FP interferometer and received by the second photodiode P2 is given by:

$$I_2(\lambda) = \frac{1 - V_T}{1 + 4\frac{R}{(1 - R)^2} \cdot \sin^2(\delta(\lambda))} \cdot I_0 \qquad (1)$$

The intensity $l_3$ of the light component reflected by the FP interferometer and received by the third photodiode P3 is given by:

$$I_3(\lambda) = (1 - V_R) \cdot \frac{4R \cdot \sin^2(\delta(\lambda))}{1 - R^2 + 4R \cdot \sin^2(\delta(\lambda))} \cdot I_0 \qquad (2)$$

where
R: reflection coefficient of the mirrors of the FP interferometer,
$V_R$, $V_T$: loss factors
$\delta(\lambda)$: function proportional to the frequency of the incident light.

The ratio of the reflected light component to the transmitted light component yields a ratio function $E(\lambda)$:

$$E(\lambda) = \frac{I_3(\lambda)}{I_2(\lambda)} = \frac{1 - V_R}{1 - V_T} \cdot \frac{4R}{(1 - R)^2} \cdot \sin^2(\delta(\lambda)) \qquad (3)$$

The intensity $l_1$ of the light component received by the first photodiode P1 is independent of the wavelength:

$$I_1(\lambda) = c \cdot I_0 \qquad (4)$$

where $l_0$ is the intensity of the input signal and c is a constant factor.

Figure 4:
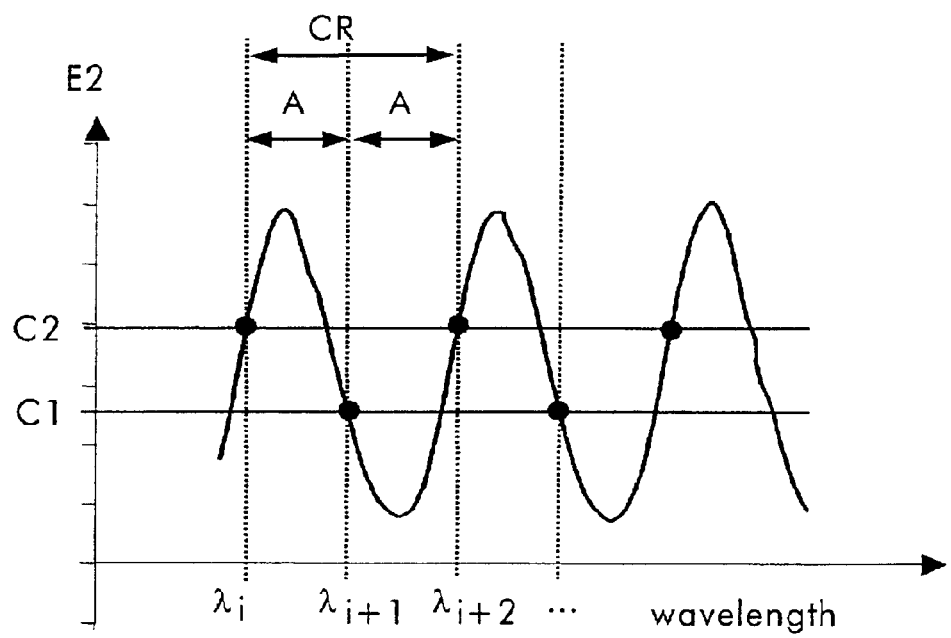
FIG. 4 illustrates the error signal of a wavelength monitor according to the invention.

Like the intensity function $l_2(\lambda)$ of the transmitted light signal, the ratio function $E(\lambda)$ is periodic with $(\delta(\lambda))=k_\pi$, where k is an element of the integer numbers. The ratio function $E(\lambda)$ has a squared sinusoidal waveform so that it is well suited to form an error signal according to FIG. 4. For the formation of the error signal, the ratio or difference of the ratio function E(λ) to the photocurrent $l_1$ is determined. The ratio function E(λ) can be generated for example by analogue calculation using a suitable electronic circuit or by numerical calculation in a computer, for example a microcontroller.

Figure 8:
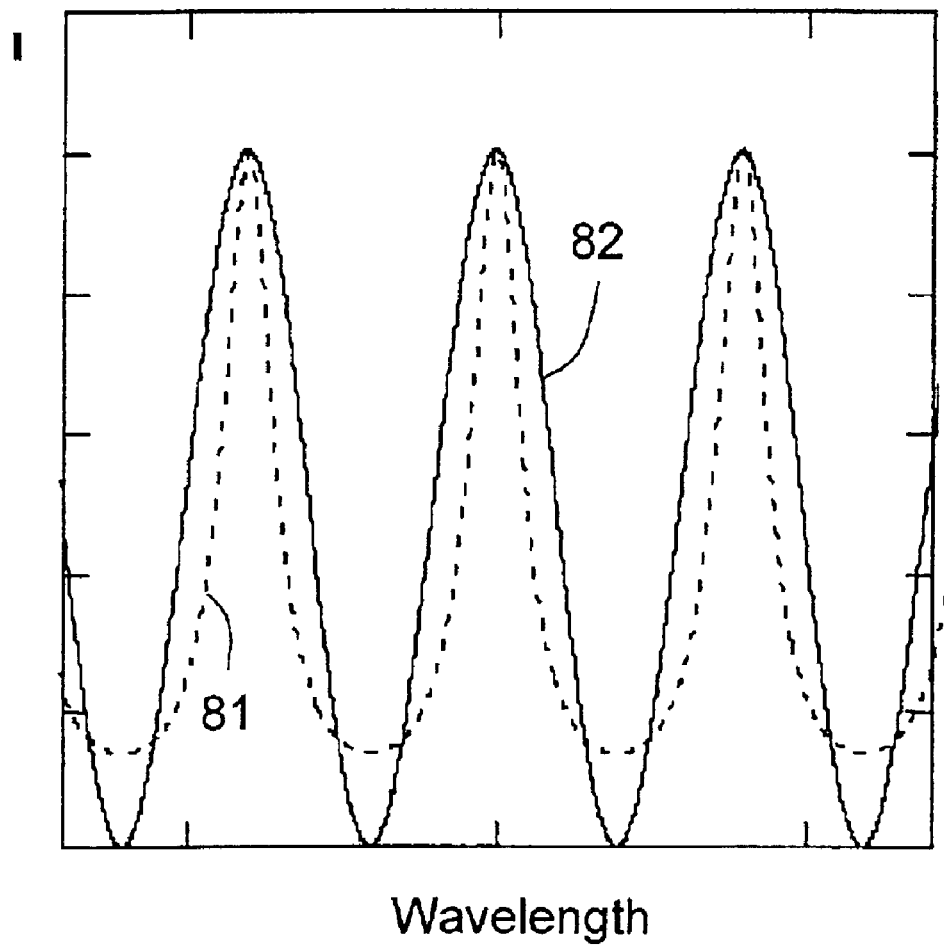

FIG. 8 illustrates a measurement result of a second laboratory model in which the waveform of an error signal 82 generated in accordance with FIG. 7 is plotted over the wavelength. Additionally, by way of comparison a comparison signal 81 has been plotted over the wavelength, said comparison signal 81 corresponding to an error signal according to the prior art and thus to the first transmission curve 61 according to FIG. 6. The transmission curves 81 and 82 have been normalised for easier comparison. The error signal exhibits the desired sinusoidal waveform.

What is claimed is:

1. A method of extending the capture range of a wavelength monitor for the lasers of a wavelength division multiplex (WDM) transmission system wherein the capture range comprises one wavelength period of a periodic error signal generated by the wavelength filter, the capture range contains a desired wavelength of a plurality of equidistant wavelengths, the lasers of the WDM transmission system are set at a desired wavelength by comparing each error signal with a comparison value that is unique in the capture range for a chosen slope sign, the wavelength period of the error signal is set such that it corresponds to double the wavelength spacing of two adjacent wavelengths of the WDM transmission system and the desired wavelength is set taking into account the slope sign of the error signal.

2. A method according to claim 1, wherein a first intensity of a light component of the laser light is directly measured and a second intensity of a light component of the laser light passing through a Fabry perot (FP) interferometer is measured, where the irradiation into the EP interferometer takes place at a specific angle to the optical axis unequal to 0 degree and the error signal is formed by linking the said intensities.

3. A method according to claim 1, wherein a first intensity of a light component of the laser light is directly measured, a second intensity of a light component of the laser light passing through a FP interferometer is measured, where the irradiation into the FP interferometer takes place parallel to the optical axis, a third intensity of the light component of the laser light reflected by the FP interferometer is measured, and the error signal is formed by linking these three intensities.

4. A wavelength monitor with a wavelength filter and means of generating a periodic error signal for setting a laser, wherein the capture range of the irradiated wavelength comprises one wavelength period of the error signal and contains a desired wavelength of a plurality of equidistant wavelengths of a WDM transmission system, wherein the wavelength filter is set such that the wavelength period of the error signal corresponds to double the wavelength spacing of two adjacent wavelengths of the WDM transmission system, the wavelengths of the WDM transmission system lying exactly alternately on positive slopes and on negative slopes of the error signal and the desired wavelength set taking into account the positive and negative slopes of the error signal.

5. A wavelength monitor according to claim 4, wherein the wavelength filter is implemented as a FP interferometer, where the means of generating the error signal consist of a first measuring means for measuring a first intensity of a direct light component of the laser light, a second measuring means for measuring a second intensity of a light component of the laser light passing through a FP interferometer, a third measuring means for measuring a third intensity of the light component of the laser light reflected by the FP interferometer, and calculating means for calculating the error signal from the intensities determined by the measuring means.

6. A wavelength monitor according to claim 4, wherein the wavelength filter is implemented as a FP interferometer, where the means of generating the error signal consist of a first measuring means for measuring a first intensity of a direct light component of the laser light, a second measuring means for measuring a second intensity of a light component of the laser light passing through a FP interferometer, and calculating means for calculating the error signal from the intensities determined by the measuring means, the irradiation into the FP interferometer taking place non-parallel to the optical axis of the FP interferometer.

7. A laser system with lasers and at least one wavelength monitor, wherein each of the lasers is set at a desired wavelength with the aid of an error signal (E), wherein the wavelength monitor is designed according to claim 4.

* * * * *